United States Patent [19]
Bird

[11] Patent Number: 5,412,614
[45] Date of Patent: May 2, 1995

[54] ELECTRONIC MATRIX ARRAY DEVICES AND SYSTEMS INCORPORATING SUCH DEVICES

[75] Inventor: Neil C. Bird, Redhill, England

[73] Assignee: U.S. Philips Corporation, New York, N.Y.

[21] Appl. No.: 928,926

[22] Filed: Aug. 11, 1992

[30] Foreign Application Priority Data

Aug. 16, 1991 [GB] United Kingdom ............... 9117680

[51] Int. Cl.⁶ ............................................. G11C 8/02
[52] U.S. Cl. .............................. 365/230.06; 365/105; 365/148; 365/163; 365/175; 365/230.08; 326/104
[58] Field of Search .................. 365/96, 100, 103, 108, 365/105, 148, 163, 230.08, 203, 175, 189.11, 175, 159, 230.06; 307/446

[56] References Cited

U.S. PATENT DOCUMENTS

| | | | |
|---|---|---|---|
| 3,245,052 | 4/1966 | Lewin | 365/175 |
| 3,781,553 | 12/1973 | Berkovskaya et al. | 365/175 |
| 3,829,846 | 8/1974 | Berg et al. | 365/175 |
| 4,679,085 | 7/1987 | Johnson et al. | 365/105 |
| 4,782,340 | 11/1988 | Czubatyj et al. | 340/825.83 |
| 4,807,974 | 2/1989 | Hirai | 350/332 |
| 4,839,860 | 6/1989 | Shinoda et al. | 365/104 |
| 4,845,679 | 7/1989 | Vu | 365/189.1 |

FOREIGN PATENT DOCUMENTS 0376830 7/1990 European Pat. Off. .
57-164494 10/1982 Japan .................................. 365/105
2066566 7/1981 United Kingdom .

Primary Examiner—Joseph E. Clawson, Jr.
Attorney, Agent, or Firm—Leroy Eason

[57] ABSTRACT

An electronic matrix array device such as a data store, e.g. a datacard, or an electro-optic active matrix display, has crossing sets of row and column conductors and matrix elements such as memory or picture cells at the crossing intersections. At least some of the matrix elements include a two-terminal thin film non-linear impedance element which may be bi-directional, such as a MIM, or unidirectional, such as a diode. The array device also includes a row address decoder for addressing the row conductors and a column address decoder for addressing the column conductors, either or both decoders having respective stages for respective conductors of the relevant set of conductors. Each decoder stage is a multi-input single output logic (AND) gate circuit having a capacitance at its output, each input being connected to the output via a respective non-linear impedance element of the same kind as employed in the matrix array, the inputs receiving address codes from a common address bus from which the gate circuit derives a selection signal for the row or column being addressed. Consequently, such a decoder can be readily integrated with at least part of the matrix array by common thin film fabrication therewith on the same substrate. This simplifies manufacture and reduces the requisite number of external connections to the array device.

15 Claims, 8 Drawing Sheets

ELECTRONIC MATRIX ARRAY DEVICES AND SYSTEMS INCORPORATING SUCH DEVICES

BACKGROUND OF THE INVENTION

1. Field of the Invention

This invention relates to electronic matrix array devices comprising crossing sets of row and column conductors and matrix elements adjacent the intersections between the sets of row and column conductors, at least some of which are two terminal thin film non-linear impedance elements connected between intersecting row and column conductors. The invention relates also to systems incorporating such matrix array devices and methods of operation of such systems.

The invention is concerned particularly, but not exclusively, with such matrix array devices which, more particularly, are data storage devices or active matrix electro-optic display devices.

2. Description of the Related Art

Data storage devices employing a row and column array of memory cells formed by sets of intersecting row and column conductors are well known. Several different types exist using various circuit elements placed at the intersections to represent the storage of a logic 1 or logic 0. For example, SRAMS using bistable latches, DRAMS using capacitors, ROMS using diodes, and PROMS using diodes and fuseable links. Data is read from, and in programmable types is written into, the array by means of address decoders and multiplexers.

Such data storage devices are commonly fabricated as integrated circuits having monocrystalline semiconductor substrates. It has been proposed, alternatively to fabricate data storage devices using thin film technology to form two-terminal thin film non-linear impedance elements, for example amorphous silicon diodes and more recently MIM (metal-insulator-metal) impedance elements, on an insulating substrate such as glass or plastics. This is described, for example, in published foreign applications GB-A-2066566 and EP-A-376830 respectively. The cost of the substrates in such devices is considerably less than, for example, the more crystalline semiconductor substrates used in conventional silicon devices. Moreover much larger areas can be employed for the data storage array. The large area electronics technology necessary for fabricating thin film devices over comparatively large areas of low-cost substrates is now well established, having been employed for example in active matrix display devices. These factors, together with the potential for such devices to store large amounts of data without recourse to electro-mechanical means for data read-out, as required for example by CD-ROM systems and optical data memory card systems, render them suited to a wide variety of uses and particularly in portable information systems.

Access to the data stored in the array can be accomplished by a peripheral circuit comprising column and row decoder circuits which provide an interface between an input address signal and a data output line. The function of the row decoder circuit is to select an individual row conductor by applying a select potential to that row conductor, according to an address value supplied to a common address bus to which individual stages of the decoder circuit, each associated with a respective conductor, are connected. The function of the column decoder circuit is to select individual column conductors according to an address value and to output the bit of information held at the intersections of the selected row and column conductors. The number of connections between the memory cell array and the peripheral circuit is determined by the number of row and column conductors. For example, with a 1M bit array at least 2049 connections would normally be required, comprising 1024 row conductor connections, 1024 column conductor connections and 1 data-output connection. It is obviously desirable therefore to integrate this peripheral circuit with the array, especially with data storage devices such as memory cards which are not permanently connected in a circuit. Commonly, address decoding and output encoding circuits utilise FET switching elements. When used with monocrystalline silicon memory cells, these FET circuits can readily be integrated with the memory cell array by common fabrication processes. However, in the case of memory cell arrays comprising thin film diode or MIM devices, the integration of FET circuits therewith would entail using fabrication processes different from those required by the memory array, thus complicating manufacture and increasing cost.

In active matrix display devices, such as liquid crystal display devices employing thin film two terminal non-linear elements, the picture elements are at the intersections of sets of row and column address conductors carried on respective, opposing, supports. Each picture element is connected between respective row and column conductors and comprises a two terminal non-linear impedance element acting as a switch, for example a MIM, back to back diodes or a diode ring structure, connected in series with a display element consisting of two opposing electrodes carried on the supports and having electro-optic material sandwiched therebetween. In operation, selection and data signals are applied to the two sets of conductors such that the display elements of one row at a time are charged according to the level of the data signals to produce the desired display effects. Such display devices are well known and widely documented. By way of example reference is invited to published GB-A-2129183 and U.S. Pat. No. 4,413,883. It is customary for the peripheral selection and data signal drive circuits to be fabricated separately from the display panel and for their outputs to be connected to the address conductors through interconnection devices. When large numbers of address conductors are involved, as is the case for many datagraphic or video display devices which comprise an array of, say, 200 by 300 picture elements, the number of interconnections required can become difficult, even when the drive circuits are in the form of integrated circuits which are mounted directly on the display panel using chip-on-glass technology.

Examples of memory array devices and display array devices using thin film diodes and the like in which the decoder circuits are integrated on the same substrate as the arrays are described in U.S. Pat. Nos. 4,782,340 and No. 4,807,974, respectively. The decoder circuits therein comprise diode-resistor type logic gate circuits. A problem with such circuits is that it is difficult to provide reliably the necessary resistors in thin film form having well controlled and accurate resistances. Moreover, the output from this type of logic circuit is transient, having a duration only corresponding to that of the applied input address signal.

It is an object of the present invention to provide a matrix array device of the kind described in the opening paragraph in which at least part of a peripheral addressing circuit can be integrated with the matrix element array on the same substrate as used for the non-linear devices of the array, and without undue complications to the manufacturing process.

SUMMARY OF THE INVENTION

According to one aspect of the present invention, there is provided an electronic matrix array device as described in the opening paragraph which further includes respective address circuits for the sets of conductors, each address circuit comprising a plurality of stages each of which is connected to a respective conductor of the associated set. At least one of the address circuits comprises a decoder circuit in which the individual stages each comprise a multi-input, single output logic gate circuit and are connected to a common address bus for applying address signals to the inputs to operate the logic gate circuits. Such device is characterised in that each logic gate circuit comprises a charge storage capacitance connected to the output and a respective two terminal thin film non-linear impedance element connected between each input and the output, the gate circuit being operable as a latch to store a charge on the capacitance indicative of the operation of the gate circuit. Thus, the decoder circuit and the matrix array utilise similar thin film components and so integration of the decoder circuit with the array is greatly facilitated. More particularly, the decoder circuit can be provided using the same thin film processing technology as employed for the array, thereby enabling the decoder circuit to be fabricated on the same supporting substrate as that of the array s non-linear devices and simultaneously with those components. The need to provide thin film resistances for the logic gate circuits is avoided, which is of great benefit in simplifying manufacture and minimizing costs. The advantages resulting from the use of the relatively simple thin film non-linear device processes are thus further realized. Moreover, by operating with a latching function, the logic gate circuits provide an output indicative of their logic operation following application of the address signals.

When said decoder circuit is used as a decoder the logic gate circuits of the individual stages function in a manner similar to that of known decoder circuits, whereby in response to a particular row address code applied to the address bus one particular stage is activated to apply a selection voltage to its associated row conductor, all other stages applying a different, non-selection, voltage to their associated row conductors. To this end, the logic gate circuits are preferably operable as AND gates each of which is connected to the address bus so as to be responsive to a respective address code and having first and second output states which are represented by respective voltages stored in their associated capacitance. The logic gate circuits can be appropriately operated so that a certain voltage is stored on the capacitance of a selectively addressed stage whereas the voltages stored on the capacitances of all other stages are at a different value, e.g. 0 volts as a result of the operation of their AND gate circuits. Besides operating as a logic gate while address signals are being applied, the latch function of the logic gate circuit means that the output condition set by the addressing signals will be maintained after removal of the addressing signals by virtue of the RC time constant of its output being in effect nearly indefinite.

The invention is particularly applicable to data storage devices and active matrix display devices. although it is envisaged that it could also be applied to advantage in other forms of electronic matrix array devices, for example image sensing arrays which use two terminal non-linear impedance elements.

In an embodiment of the invention in which the matrix array device comprises a data storage device, the row decoder circuit operates similarly to conventional row decoder circuits to select a row of memory locations by providing a selection signal level to the relevant row conductor in response to the appropriate address code being applied to the address bus.

Such a decoder circuit may be used in addition or instead as a column decoder, in which case the logic gate circuits function in a similar manner to that described above to select columns of the array according to column address codes applied to the address bus. Upon the selection of a particular column the capacitance of the selected row can discharge into the capacitance of the column decoder stage associated with that column if a non-linear device is present at the appropriate memory cell. The presence or absence of this transferred voltage can be detected to provide an output indication of the stored data, following which another memory cell can be addressed.

The integration of the row and/or column decoder circuit with the array naturally has the benefit of reducing the number of external connections which are necessary. Maximum advantage in this respect is of course obtained by integrating both decoder circuits.

In an embodiment in which the matrix array device comprises an active matrix electro-optic display device, the decoder circuit can be operated so as to apply selection signals to the associated set of conductors. By applying appropriate address signals in sequence, each conductor of the set may be provided with a selection signal in turn so that the picture elements are driven for example on a row at a time basis as required for video or TV display devices. Alternatively, the decoder circuit may be operated by appropriate choice of address codes, so as to address the individual conductors selectively other than on a sequential basis. Data signals can be supplied to the other set of conductors in conventional fashion if grey scale display is required. If, however, grey-scale display is not required then a simple form of display, for example suited to datagraphic display purposes, may be obtained by using a similar decoder circuit to drive the other set of conductors; the two possible outputs from the stages thereof being utilised to provide two different display states, for example on and off in a liquid crystal display device.

The non-linear impedance elements may be unidirectional, for example pin or nip diodes, or bidirectional, such as MIMs, back to back diodes or diode rings. Preferably, the non-linear elements are MIM thin-film devices. Such thin devices are of comparatively simple structure, comprising basically a pair of conductive layers separated by a thin insulating layer. Their fabrication is straightforward, requiring few processing operations and without the need for sophisticated, and expensive, equipment. The components of the stages of the decoder circuit can be readily fabricated simultaneously with components of the matrix element array from common deposited layers.

The capacitance connected to the output of a stage could in certain circumstances be constituted by the capacitance inherently associated with the address conductor to which that output is connected. Preferably, however, a physical capacitor is employed, one side of which is connected to the output and to the other side of which a predetermined potential is applied. It will be appreciated that capacitors are simple to provide in the case where MIM devices are used since they can be formed from the same materials.

According to another aspect of the present invention, there is provided a system comprising an electronic matrix array in accordance with the first aspect of the invention and drive circuit means connected to the address bus of the decoder circuit for applying address signals to the address bus, which signals comprise reset signals for setting the voltage of the capacitances of the logic gate circuits to a predetermined level followed by selection signals for operating the logic gate circuits such that the charge stored on the capacitances of the selected individual logic gate circuits and the remaining non-selected logic gate circuits are respectively different.

In one embodiment the operating cycle of the logic gate circuit may be such that the capacitance of each of the logic gate circuits is initially set to a predetermined state, either charged or discharged depending on the decoder circuit concerned. To this end address waveform signals applied to the logic gate circuits determine a reset phase, during which the capacitance is set to its initial state, followed by an input phase in which the charge state is set according to the applied address code. This charging or discharging in the reset phase may be accomplished in the case where bidirectional devices are employed by selecting suitable waveforms applied to the address bus. Alternatively, or in the case where unidirectional non-linear devices are employed, each stage may further include a reset input to which an appropriate reset voltage is applied, the reset being connected to the output via an additional two terminal non-linear device, e.g. a MIM device. When used in a row decoder circuit, the capacitance associated with a stage can be charged, for example through the reset input, to a selection voltage level and thereafter either discharged or not according to the operation of the AND gate circuit in response to an applied address code. In the case of the column decoder circuit in a data storage device, the capacitance associated with a stage can be initially discharged during the reset phase, for example, by placing an appropriate voltage at the reset input, and thereafter, upon selection of a row, be either charged or not depending on whether or not a non-linear device is present at the intersection of the selected row and column associated with that stage. When an address code is then applied to the column decoder stages during the input phase, the logic gate circuits of the individual stages, acting as AND gates, operate either to discharge, if necessary, those capacitances of stages not addressed, or in the case of the addressed column to maintain the state of the associated capacitance as determined by the presence or absence of a non-linear device at the intersection between that column and the selected row. In order to provide an output from the column decoder circuit indicative of the charge state of the capacitances, and thus the data stored in the array, the column decoder circuit may include at least one further multi-input, single output logic gate circuit whose inputs are connected to the outputs of the first-mentioned logic gate circuits and to the output via respective two terminal non-linear devices, each such further logic gate circuit having capacitance connected to its output. Each further logic gate circuit functions as an OR gate. A single further logic gate circuit whose inputs are connected to the outputs of all stages in the column decoder circuit can then provide a bit at a time serial output. A plurality of such further logic gate circuits may be used, the inputs of each such circuit being connected for example to the output of every eighth stage of the column decoder circuit. Thus, with the first-mentioned logic gate circuits arranged such that upon receipt of a single address code every eighth column is accessed, a byte-wide (8 bits) output will be obtained.

Alternatively, the capacitances of the logic gate circuits of the column (or row) decoder circuit may simply be connected to an output line which is common to at least some of the logic gate circuits and which, when data is to be read out from the array, is connected to an integrator circuit in the reading means from which data output is obtained.

BRIEF DESCRIPTION OF THE DRAWINGS

The invention will now be described, by way of example, with reference to the accompanying drawings, in which.

It should be understood that the Figures are merely schematic and are not drawn to scale. It should also be understood that the same reference numerals are used throughout the Figures to indicate the same or similar parts.

DETAILED DESCRIPTION OF THE PREFERRED EMBODIMENTS

Electronic matrix array devices, such as data storage devices and active matrix display devices, comprise row and column arrays of matrix elements, namely memory cells and picture elements respectively, which are addressed via sets of row and column conductors. In the case of a data storage device, the matrix elements comprise two terminal thin film non-linear devices connected between associated row and column conductors at least at some of the intersections of the crossing sets of conductors. In the case of a display device, the matrix elements comprise picture elements which each consist of a display element connected in series with a two terminal thin film non-linear impedance element between associated row and column conductors. Such devices further include row and column address circuits, at least one of which comprises a decoder circuit using non-linear impedance elements of the same kind as those of the array and having a respective stage for each conductor of its associated set, such stage being a logic gate circuit having a plurality of inputs connected to an address bus common to all stages and a single output connected to the associated conductor. Each input is connected to the output through a respective two terminal thin film non-linear device, the output being connected to an associated capacitance. The logic gate circuits operate in the manner of AND gates having a latching function whereby in response to a particular address code supplied to the address bus a certain conductor of the set is selected to be enabling. In case of a data storage device the data stored in the memory element associated with that conductor is accessed. In the case of a display device the display information be written into the picture elements associated with that conductor is accessed.

The invention will be described first with reference to its embodiment as a data storage device, and then to its embodiment as an action matrix display device.

1. Data Storage Device Embodiment

Figure 1:
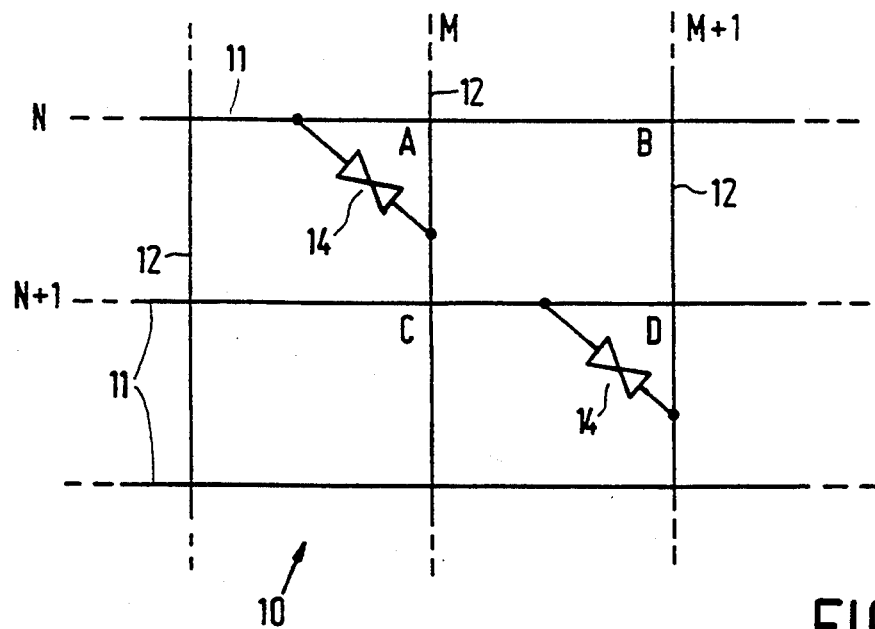
FIG. 1 shows schematically a part of the matrix array of a first embodiment of a matrix array device according to the invention which comprises a data storage device having an array of memory cells including bidirectional non-linear impedance elements.

Referring to FIG. 1, the data storage device comprises a row and column (Y and X) memory array 10 with individual memory cells being formed at the intersections of crossing sets of row and column (Y,X) address conductors 11 and 12. Only four such memory cells associated with the rows N and N+1 and columns M and M+1 are present in the part of the array illustrated in FIG. 1. For simplicity, the array depicted in FIG. 1 is an ROM in which bits of data are represented by the presence of absence of a two terminal thin film non-linear impedance element 14 at selected intersections. In the illustrated example, intersections A and D have non-linear impedance elements between the row and column conductors, representing logic 1, whereas intersections B and C have no such connections and so represent logic 0. In this example the non-linear impedance elements 14 are MIM (Metal-Insulator-Metal) thin film devices. Such devices, which may be regarded as a type of diode structure, are bidirectional and, by virtue of their non-linear resistance behaviour, exhibit a threshold switching characteristic. A typical MIM device comprises a pair of conductive films between which a comparatively thin insulating layer is sandwiched.

The array depicted in FIG. 1 is a read-only structure. The MIM devices may conveniently be formed by providing a thin insulating layer at selected cross-overs of the row and column conductors, whereby overlying areas of the row and column conductors constitute the opposed conductive layers of the MIM structure, and providing comparatively thick insulator layers at other cross-overs where MIM devices are not required. The array is fabricated using thin film layers and photolithography on an insulating support of plastic or glass, and in this respect follows conventional practice. The memory array is of the so-called mask-programmed kind in which the pattern of the MIM device locations, and thus the stored 1 s and 0 s, is determined by masks used during fabrication. Assuming, for example, that the row and column conductors are around 5 micrometers wide and spaced apart by a corresponding amount, a 16M bit array (4096 by 4096) will occupy an area approximately 4 cm square.

Figure 2:
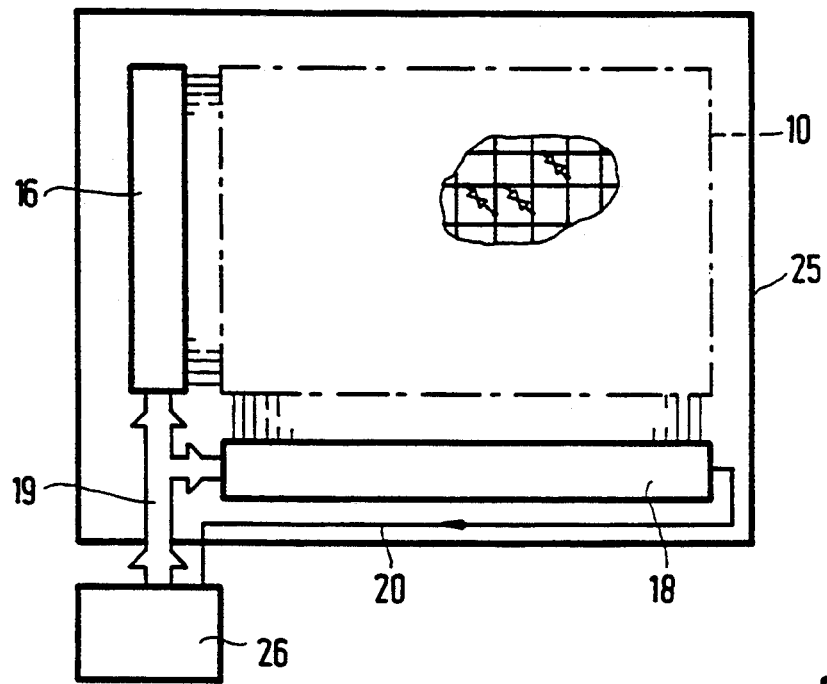
FIG. 2 is a schematic circuit diagram of the data storage device together with reading means.

Access to the data stored in the array structure is accomplished by a peripheral circuit which, with reference to FIG. 2, comprises row and column decoder circuits 16 and 18. These circuits provide an interface between an input address signal, applied to an address bus 19, and a data output line, 20.

As the capacity of the memory cell array increases, the number of necessary connections to the array will increase correspondingly. For example a small 1M bit array will require at least 2049 connections, namely 1024 row connections, 1024 column connections and 1 data-out connection. For this reason, address decoding is integrated on the same card as the analog, to reduce the number of required external connections.

The circuits 16 and 18 are formed on the same support 25 on which the memory array 10 is formed, using similar thin film technology to that employed for forming the data storage cells of the array, as described hereinafter, so that a data storage device is obtained which requires comparatively few external interconnections to means for reading the stored data. Such a read device 26 is depicted in block form in FIG. 2. The data storage device is particularly suited to applications where portability is desired, for example in the manner of a smart card or data card which is not permanently connected and is removable from the reading equipment. The data storage device satisfies the need for large capacity, low cost, data storage media, based on inexpensive substrates, which unlike CD-ROMs and optical data storage cards require no moving parts in the read device.

Address decoding in the data storage device is preformed by a 2.n to $2^n$ decoder circuit to convert a binary address code of n bits into a selecting voltage for selecting one of the rows in the case of a row decoder circuit or one of the columns in the case of a column decoder circuit. Using the aforementioned example of a 1M bit memory device, the number of external connections then required to the data storage device, excluding any necessary power and ground lines, is reduced to 41, (ten row address, ten inverse row address, ten column address, ten inverse column address and one output).

The row and the column address decoder circuits 16 and 18 are realised in this embodiment using MIM devices, thereby obtaining the advantages resulting from the relative simplicity of the MIM processing used for the memory array.

Figure 3:
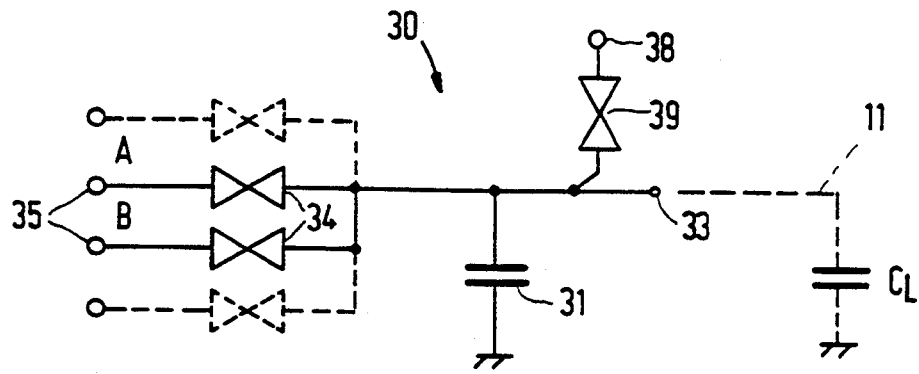
FIG. 3 shows schematically the configuration of a typical logic gate circuit used in one version of a row decoder circuit of the data storage device.

The function of the row decoder circuit 16 is to select one of the rows 11 in the memory array 10 according to an address inputted to the circuit via the address bus 19. A row can be considered to be selected if the voltage on that row is different from the voltage present on all the other rows. More particularly, a row is selected when a select voltage, designated $U_{high}$, is applied to that row, all other rows being at a different voltage, for example ground reference potential. The circuit 16 en comprises a number of stages corresponding to the number of rows 11, the output of each stage being connected to a respective row. Each stage is an AND logic gate circuit having multiple inputs and a single output. The inputs are connected to respective address lines of an address bus which is common to all stages, each gate being connected to a different and individual combination of address lines, and the output is connected to the associated row conductor 11. The basic circuit configuration of a typical AND gate stage is depicted schematically in FIG. 3. Therein the AND gate circuit 30 comprises an output capacitor 31 one side of which is connected to ground and the other side of which is connected to an output 33 and also to the binary signal inputs 35 of the gate circuit via respective MIM devices 34. The output 33 and capacitor 31 are connected also to a reset node 38, which is coupled to a common line of the address bus, via a further MIM device 39. The capacitive load associated with the row conductor 11 which is connected to the output 33 is represented by the capacitor $C_L$. The number of inputs can be varied according to requirements. The circuit depicted in FIG. 3 is shown as having only two inputs, A and B, for simplicity. Two further possible inputs are shown in dotted outline by way of example. For an array having $2^n$ rows, each gate circuit 30 will have n inputs.

Operation of the gate circuit is similar to that of dynamic logic and involves, during each complete AND function cycle, a reset phase and an input phase. Optionally, depending on the mode of operation employed, the cycle may further include a transfer phase. The gate circuit of FIG. 3 can be made to function instead as an OR gate by suitably choosing appropriate voltage levels during the reset and input phases, as will be described hereinafter. In the following description of the operation of the gate circuit 30 as an AND gate various voltage levels are referred to which are defined as follows:

$U_{high}$ is the row selection voltage obtained at the output 33 of the gate circuit, and represents a logic 1. In practice this voltage may be around 4 volts.

$U_{low}$ is the voltage at the gate output 33 which represents a logic 0. In practice this can be chosen to be nominally 0 volts.

$V_{high}$ is the voltage applied to one of the gate inputs 35 necessary to charge the output capacitor 31 to $U_{high}$.

$V_{low}$ is the voltage applied to an input 35 required to discharge the output capacitor 31 to $U_{low}$.

$U_{hold}$ is a voltage such that the current flowing through a MIM device when the voltage across the device is equal to or less than $\pm(U_{high}-V_{hold})$ or $\pm(U_{low}-V_{hold})$ is less than a prescribed leakage current.

Vr is the reset voltage required to reset the output capacitor to logic 1, i.e. $U_{high}$.

The values of these voltages in practice will depend on the electrical design of the gate circuit, i.e. the capacitance of output capacitor 31, the dimensions of the MIM devices 34, the clock periods, etc., and will additionally be determined by the actual loading of the gate circuit. Conversely, the input/output voltage levels may be predefined, in which case the MIM device dimensions will need to be chosen to ensure that the gate circuit operates correctly at those levels.

Figure 4:
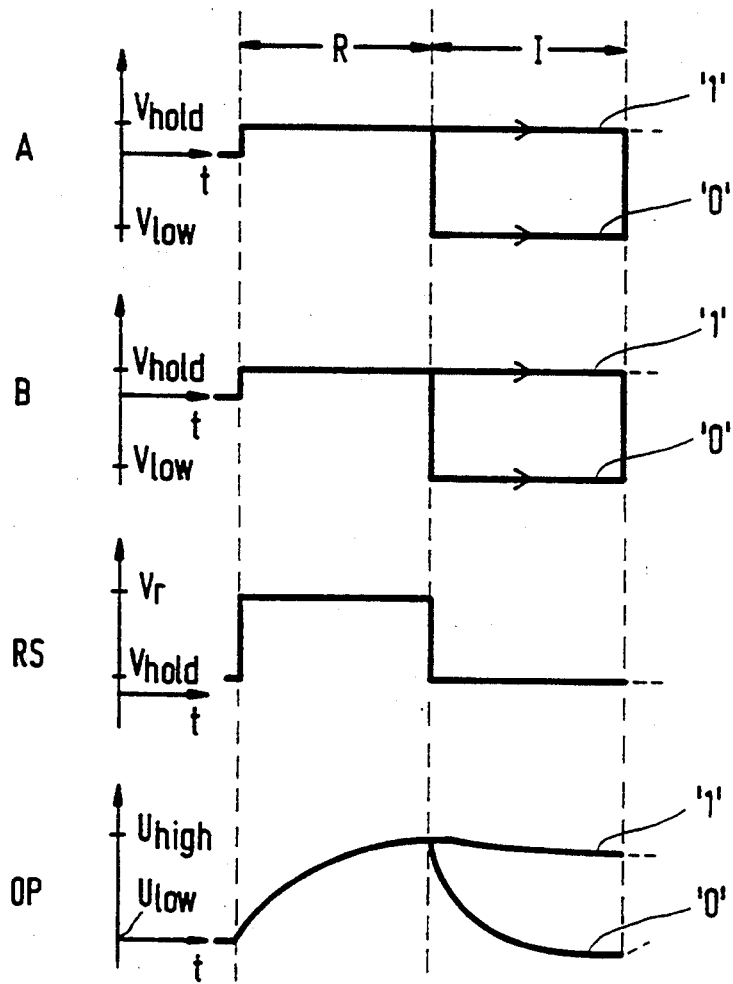
FIG. 4 illustrates various waveforms present during operation of the logic gate circuit of FIG. 3 when used as an AND gate.

Examples of waveforms appearing in the gate circuit 30 during one AND function cycle, comprising a reset phase R and an input phase I, are shown in FIG. 4. Therein A and B represent the two input terminals, as previously, and RS and OP represent respectively the voltage at the reset node 38 and at output terminal 33. For simplicity, possible capacitive feedthrough effects have been omitted. The AND gate works in such a way that the output of its operation is stored as a voltage on its associated capacitance, after which the gate is turned off. During the reset phase, R, the output of the gate, i.e. the voltage of output capacitor 31, is charged to the voltage $U_{high}$ representing logic 1. This is accomplished by applying a reset voltage Vr to the reset input 38. For the duration of this phase the inputs A and B are held at $V_{hold}$. At the end of the reset phase the output of the gate will be at logic 1, and the voltage at 38 is returned to $V_{hold}$ so that no, or very little, charge leaks from the gate circuit. At this point, the input phase I begins, and voltages are applied to the inputs A and B as follows. A logic 0 at a given input is represented by $V_{low}$ such that the output capacitor 31 will be discharged to logic 0 ($U_{low}$). A logic 1 at a given input is represented by $V_{hold}$. The result of applying these voltages to the inputs A and B is the discharge of the output capacitor 31 if either of the inputs A and B go to logic 0 ($V_{low}$). Conversely, only if both of the inputs remain at logic 1 ($V_{hold}$) will the output OP remain at logic 1 ($U_{high}$). Thus an AND function is achieved. It will be understood that the same rules apply in the case of a gate circuit having more than two inputs, that is the output will only remain at logic 1 if all inputs are at $V_{hold}$ during the input phase. With the RC time constant of the circuit being in effect near infinite, a latching operation is obtained and the charge state of the capacitance is retained following termination of the input phase.

For an x input gate circuit, the output pull-down may be the result of up to x logic 0 inputs. The value of $U_{low}$ may to a certain extent be dependent on the actual number of 0 s on the gate inputs. This effect can be minimised in practice by suitable dimensioning of the MIM devices 34.

In the above operating scheme the output signal is transferred to the load, that is a row of memory cells, during the input phase. In other words, the load constitutes part of the total output capacitance of the gate circuit. In some circumstances, there may be no need to provide the output capacitor 31 in the gate circuit, the necessary function adequately being performed by the load, $C_L$, alone. However, a separate output capacitor, 31, may be desirable in cases where the load capacitance varies so as to reduce the sensitivity of the voltage levels to variations in the load capacitance.

Figure 5:
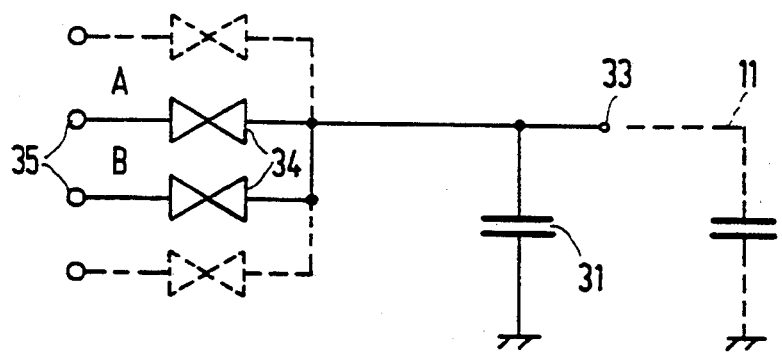
FIG. 5 shows schematically the configuration of an alternative logic gate circuit used in a second version of the row decoder circuit.
Figure 6:
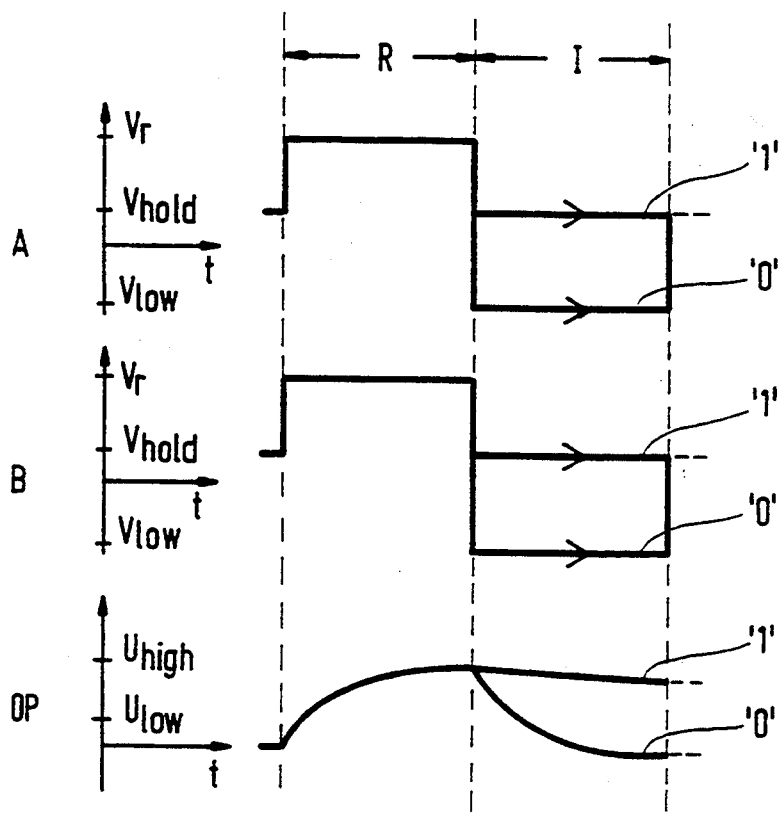
FIG. 6 illustrates various waveforms present during operation of the logic gate circuit of FIG. 5 when used as an AND gate.

In the above-described example of a gate circuit, separate input and reset lines, each connected to the gate capacitance by an individual MIM device, are used. However, it is possible for these functions to be obtained using the same lines. To this end, the gate input signals become tri-level, producing at the gate output the reset voltage during the reset phase and the value defined by the logic inputs during the input phase. FIG. 5 illustrates a second embodiment of a gate circuit, again having just two inputs A and B for simplicity, and which is identical to that of FIG. 3 except that the reset line and the associated MIM device 39 are omitted. FIG. 6 illustrates the waveforms appearing in operation of this gate circuit. As before, the possible effects of capacitive feedthroughs are not shown. As can be seen, during the reset phase R the inputs A and B are both supplied with the reset voltage $V_r$, as a consequence of which the output (or load) capacitance is charged to the select voltage $U_{high}$. Thereafter, in the input phase I, the circuit operates in generally identical manner to the earlier embodiment so as to provide a logic 1 output only if logic 1 s are applied to both inputs A and B.

Figure 7:
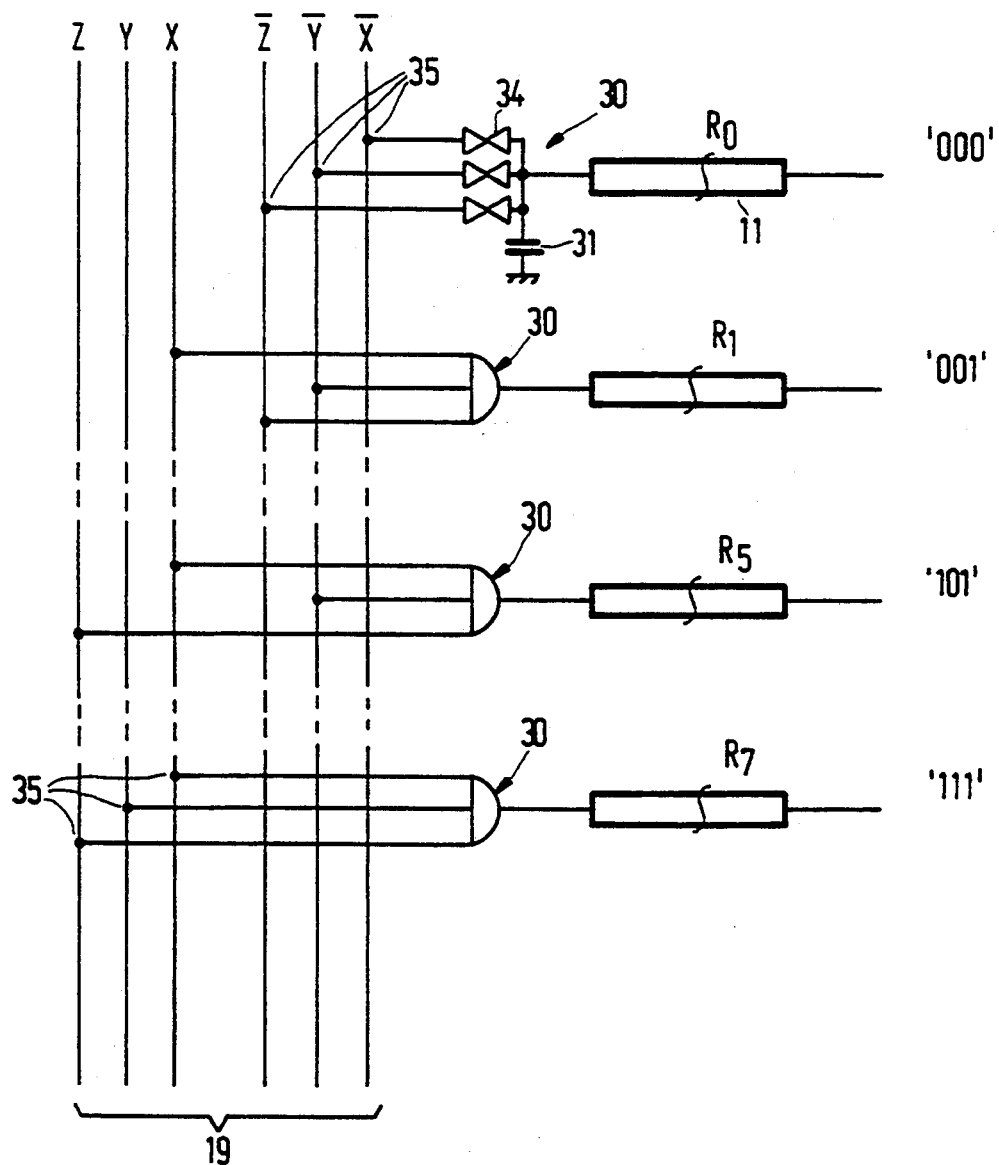
FIG. 7 illustrates schematically a part of the row decoder circuit associated with a few typical rows of the memory array of the data storage device.

The row decoder 16 comprises a plurality of gate circuits as described with reference to FIG. 3 or FIG. 5, each gate circuit being connected to a respective row conductor 11 of the memory array 10. The decoder 16 functions as a 1-of-N decoder, charging one of the rows of memory cells selected by the code on the address bus 19 to a voltage representing the selected state ($U_{high}$). The remaining unselected rows of the memory array are (dis-)charged to a voltage representing the unselected state ($U_{low}$). In terms of normal logic, this operation is obtained in the manner illustrated in FIG. 7, this example being for the case of an address code which is three bits wide. FIG. 7 shows schematically a part of the circuit of the row decoder 16 associated with four typical but not immediately successive rows of the memory array, namely rows 0, 1, 5 and 7, designated $R_0$, $R_1$, $R_5$ and $R_7$ respectively. The logic gate circuits are of the kind depicted in FIG. 5, with that associated with row $R_0$ being shown in detail and with those associated with the other rows being represented by AND logic symbols.

Each address code bit is carried on two lines of the address bus 19 in its non-inverted and inverted state respectively. Thus six lines are entailed, designated x, y and z and their inverse x, y and z. This address inputting arrangement allows the 1-of-N decoder to be constructed solely from AND gates. For example, the gate associated with row R5 will only output a logic 1 (i.e. $U_{high}$ as previously defined) to select that row upon receipt of the address xyz—101. As this gate is required to respond to x=1 and z=1 the corresponding inputs are connected to the non-inverted x and z lines. In the case of the y bit, the gate must respond to y=0, and hence the corresponding input is connected to the y line, which is 1 when y=0. This embodiment of the row decoder circuit uses the tri-level drive scheme, thereby avoiding the need for a reset line for the gate circuits, since all necessary address voltages are supplied form an external source (read device 26). However the FIG. 3 type of gate circuit which requires reset pulses may of course be used instead if desired.

Figure 8:
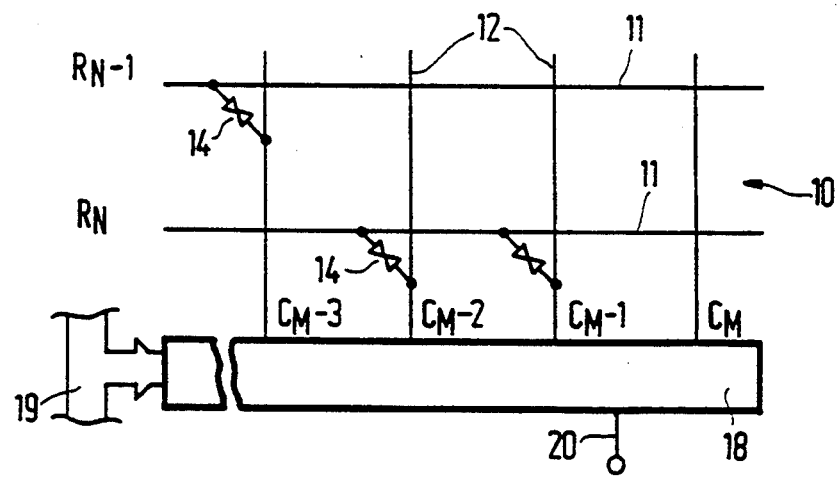
FIG. 8 shows schematically parts of the memory array and column decoder circuit of the data storage device.

The column decoder 18 (FIG. 2) functions to select one or more columns of memory cells at any one time according to an address on the address bus 19 and to place the signal from the selected column conductor(s) 12 on the data output line 20, such output being indicative of the state of the memory cell at the intersection between the selected row conductor and selected column conductor, and thus at the bit of information, or data, stored at that location. FIG. 8 shows a typical part of the memory array, comprising eight memory cells at the intersections of four columns with two rows $R_{N-1}$ and $R_N$, and the connection of each cell via the associated column conductors 12 to the column decoder circuit 18. Assuming, for simplicity, that the column conductors 12 are held at ground potential and that row $R_N$ has been selected by the operation of the row decoder circuit 16. Then due to the non-zero voltage dropped across the two MIM devices 14 connected to row $R_N$ a current will flow into the inputs of the column decoder associated with column conductors $C_{M-2}$ and $C_{M-1}$. (The MIM device at the intersection of the column $C_{M-3}$ and row $R_{N-1}$ is not conducting since the that view was not selected, and column $C_M$ has no connections to either row). Upon the selection of one of the columns by the decoder circuit 18 by an appropriate address code on the address bus 19, the signal in that column will be placed on the data output line 20. The output line 20 is connected to the reading device 26, wherein an amplifier provides a low impedance output in known manner.

In similar manner to the row decoder 16, the column decoder 18 comprises a plurality of stages, one for each column conductor 12, which are fabricated using the same thin film technology as employed for the memory array 10 so as to facilitate integration of column decoder 18 on the same substrate as the memory array and the row decoder 16, and, importantly, to enable the column and row decoders to be fabricated simultaneously with the memory array by photolithographic definition of common deposited layers. Like the row decoder 16, the individual stages of the column decoder 18 consist of AND type logic gate circuits using MIM devices.

An implementation of the column decoder 18 using MIM devices will now be described with reference to FIG. 9, which shows a part of the column decoder circuit connected to associated columns of the memory array. The part of the memory array shown comprises three memory cells MIM devices 14 representing logic 1 being present at the two cells constituted by the intersections of row $R_N$ and columns Cx−1 and Cx+1, the third cell at the intersection of row $R_N$ and column Cx having no MIM device and so representing a logic 0. Each column conductor 12 is connected to a respective stage of the column decoder 18, which comprises AND logic gate circuits 30 as described previously with reference to FIG. 3. Thus each gate circuit 30 has a plurality of inputs 35, in this example three assuming a three bit column address code is used, connected via respective MIM devices 34 to one side of the gate circuit s output capacitor 31. The other side of the capacitor 31 is connected to a reference voltage line 52 common to all stages 30. The reset input of each stage, comprising a MIM device 39, is connected to a common reset line 51.

The inputs 35 of a gate circuit are connected to individual lines of a column address bus 50 included in the main address bus 19, the inputs of each gate circuit being connected to a different combination of column address lines in a manner similar to that used for the gate circuits of the row decoder 16 as described above with reference to FIG. 7. Thus the column address bus 50 consists of six lines, the lines x, y and z carrying a three bit address code and the lines x, y and z carrying the inverse of such address code. The address code applied to the column address bus 50 comprises the least significant part (bits) of the complete address code supplied to the bus 19, the most significant part (bits) of such code being routed to the address lines for the row decoder 16.

The output of each gate circuit is at the junction between the MIM devices 34 and the capacitor 31, and is connected via a respective MIM device 54 to a line 55 common to all stages and which goes to an output terminal 56 to which a capacitor 60 is connected. A reset input 61 is also connected to the line 55, via a MIM device 62. Voltage signals produced at the output terminal 56, constituting the output 20 in FIG. 8 and representing the stored data, can be fed into a high impedance buffer circuit in the reading device 26. The capacitor 60 in practice may be partially constituted by parasitic capacitance and partially by a sense capacitance (the input of a sense amplifier) in the reading device 26, and as such does not necessarily comprise a physical component of the column decoder.

Figure 10:
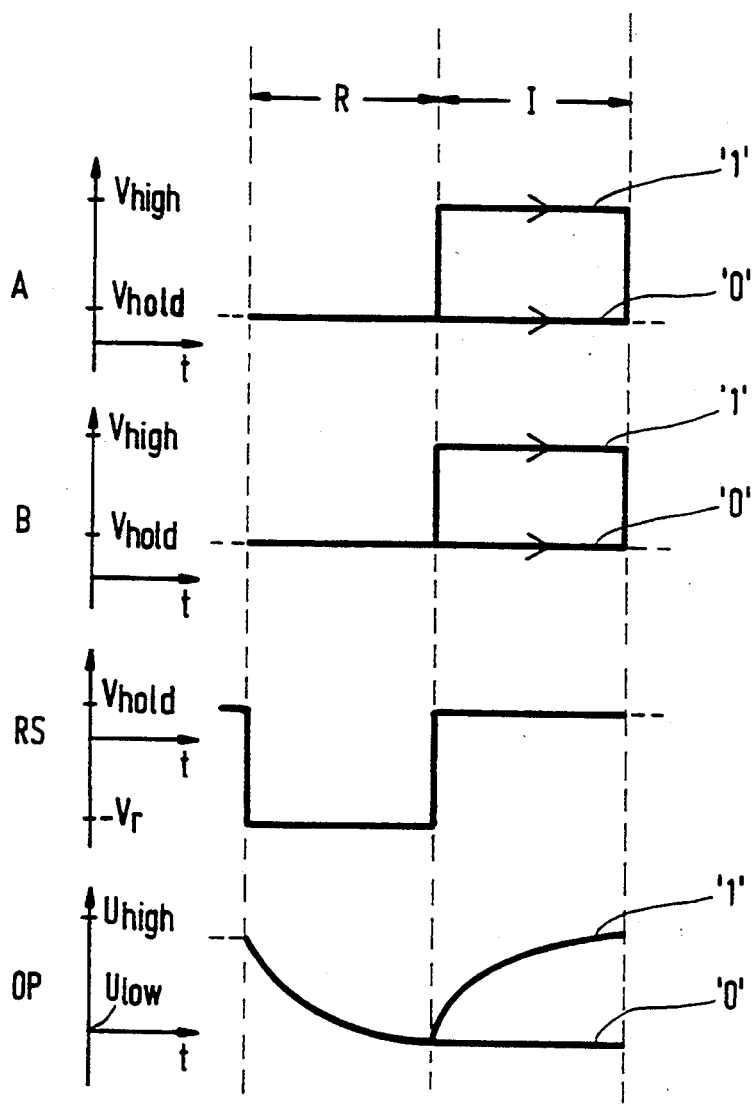
FIG. 10 illustrates, in similar manner to FIG. 4, various waveforms present during operation of the logic gate circuit of FIG. 3 when used alternatively as an OR gate.

The MIM devices 54 connected between the capacitor 31 of the stages and the output 56 constitutes an OR type logic gate. It can be seen that the components 54, 55, 60, 61 and 56 are interconnected in the same manner as the components of the AND gate circuit of FIG. 3. The AND gate in FIG. 3 can, as previously mentioned, be made to function as an OR gate by the choice of appropriate voltage levels during the reset/input phases of its operating cycle. FIG. 10, which is similar in many respects to FIG. 4, illustrates waveforms present in the operation of the gate circuit of FIG. 3 when it is used in an alternative mode as an OR gate. As in FIG. 4, a gate circuit having only two inputs A and B, will be considered for simplicity. Referring to FIGS. 3 and 10, during the reset phase of one complete OR function cycle all inputs to the gate circuit, i.e. A and B, are at the hold voltage $V_{hold}$ except for the reset line 38, to which a reset voltage Vr is applied which, as will be apparent from comparing FIGS. 4 and 10, is different from that used for the AND gate function. The reset voltage Vr charges the output capacitor 31 to the logic 0 level. At the end of the reset phase, the reset input returns to the hold voltage, $V_{hold}$, and input levels are applied to the other gate inputs A and B according to the following rules. Using the previously defined terms, a logic 0 at an input is represented by $V_{hold}$. A logic 1 at an input is represented by $V_{high}$, this voltage being sufficient to charge the output capacitor 31 to the voltage, $U_{high}$ chosen to represent a logic 1 at the gate circuit output. In this way, if any of the inputs is high then the output capacitor 31 will be charged to the logic 1 level, so that an OR function is achieved.

Referring now again to FIG. 9, in which the components 54, 60, 61 and 62 are the same as the components 34, 31, 38 and 39 respectively, the operation of the column decoder 18 is synchronised with that of the row decoder 16 and takes place in conjunction with operation of the row decoder 16 in five phases. The first phase is a reset phase which occurs simultaneously with the rest phase of the row decoder circuit s operation cycle during which all the rows of the array are charged to a positive voltage, U high, representing 1. The object of the reset phase of the column decoder circuit operation is to discharge completely the capacitors 31 of the AND gate circuits 30 of the stages. To this end a negative reset voltage is placed on the reset line 51, while the inputs 35 to the AND gate circuits are kept at $V_{hold}$ and the voltage applied to the line 52, $V_B$, is held at 0 volts. Consequently, the capacitors 31 are discharged. At the end of this reset phase, the reset line is returned to the level of $V_{hold}$.

This is followed by an MSB (Most Significant Bits) address phase in which the MSB address input on the bus 19 to the row decoder circuit 16 is valid and, by operation of the circuit 16, all the rows except for the one defined by the address value, are discharged to $U_{low}$ (representing the unselected state and nominally 0V). All the inputs 35 to the AND gate circuits 30 of the column decoder circuit 18 are held at $V_{hold}$ for the duration of this phase. The capacitance of the particular stage of row decoder circuit 16 selected by the address is thus charged to the logic 1 level.

Thereafter, in a third, row copy, phase current flows from the selected row conductor 11 into those columns 12 which are connected with the selected row conductor by a MIM device 14, as a result of the voltage stored on the selected row capacitance, and charges the associated capacitors 31, thus creating a copy of the charge pattern on that row. That is, with regard to the example shown in FIG. 9, column conductors Cx−1 and Cx+1 will be charged from row conductor $R_N$ via the MIM devices 14 of the array. This charge transfer is enabled by making VB negative. During this phase, and likewise the fourth and fifth phases described below, the address inputs to the row decoder circuit 16 remain valid, i.e. the row decoder circuit is operating in its input phase as previously described.

The voltage across a MIM device 14 connecting a column conductor, e.g. Cx−1, and the selected row conductor 11 will be $U_{high}$ volts, and that across a MIM device connecting a column conductor 12 and an unselected row conductor 11 will be 0 volts. As the value of $U_{high}$, for example around 3 volts, may be insufficient to result in appreciable conduction in a MIM device 14 at the selected row, $V_B$ is taken negative for this phase to cause the relevant MIM devices in the array to conduct.

A column decoder circuit address phase then takes place, using the Least Significant Bits (LSB) of the address code. The address phase is substantially the same as the address phase of the row decoder 16 and the manner in which the decoder 18 operates to select an individual column conductor, as defined by the address, follows that of the row 16 as described above with reference to FIG. 7. An address logic 0 is represented by a negative voltage and logic 1 by $V_{hold}$. In this way, the capacitor 31 of all stages of the column decoder 18 apart from the one defined by the LSB address value are discharged to zero volts by the action of the address inputs. At the end of this phase the inputs 35 to the gate circuits 30 of the column decoder are returned to $V_{hold}$ and the state of charge of their capacitors 31 depends on the data bit held at the relevant row/column intersections. Thus, if the data bit held at the intersection of the row and column defined by the MSB and LSB of the address information applied to bus 19 is logic 1, i.e., a MIM device 14 is present at that intersection, the capacitor 31 of the column decoder circuit stage associated with that selected column conductor will be charged to a positive voltage and the capacitors 31 of all other stages will be discharged. If the data bit held at that intersection is logic 0, i.e. there is no MIM device 14 present at the intersection, then the capacitors 31 of all stages will be discharged.

In a subsequent transfer phase, the data bit selected by the address information is output from the data storage device on line 56 by operation of the gate constituted by the components 54 and 60. To this end, and bearing in mind that the voltages involved may be insufficient to result in appreciable conduction in the MIM devices 54, a trigger voltage Vx, which is applied to the opposite side of the capacitor 60, is set to a negative value in order to load the accessed data bit into the reading device 26 at the output 56. At all other times, the side of the capacitor 60 remote from the output line 56 is at 0 volts, i.e. Vx=0 volts.

The five phases of an operating cycle of the column decoder 18 have been described above in a time-divided sequence for clarity. However, in practice it may be possible to combine certain operations in a single time slot.

Following this cycle of operation a new address can then be applied to the bus 19 to access another data bit stored in the memory array.

For simplicity, the effects of possible charge feed-through in the MIM devices self-capacitance have not been considered in the above description. Such effects would not alter the manner of operation significantly. If necessary, compensation for these effects can be provided by suitably choosing the signal levels employed.

Various modifications to the column decoder 18 are possible. As with the row decoder circuit 16, the reset line 51 may be omitted and instead the reset function for the AND gate circuits 30 can be achieved by using tri-level address lines.

Also, by re-structing the data storage device, byte-wide data may be accessed rather than a bit at a time as described. A byte-wide, for example 8 bits, parallel output can be accommodated by arranging that a given LSB address value accesses the stage output capacitors 31 associated with every eighth column. In this case eight OR gate circuits will be used, rather than one as previously, each providing one bit of the parallel output, the inputs of the OR gate circuit being connected to the outputs of the AND gate circuits 30 associated with columns 1, 9, 17, etc., the inputs of the second OR gate circuits being connected to the outputs of the AND gate circuits associated with columns 2, 10, 18, etc., and so on.

Figure 9:
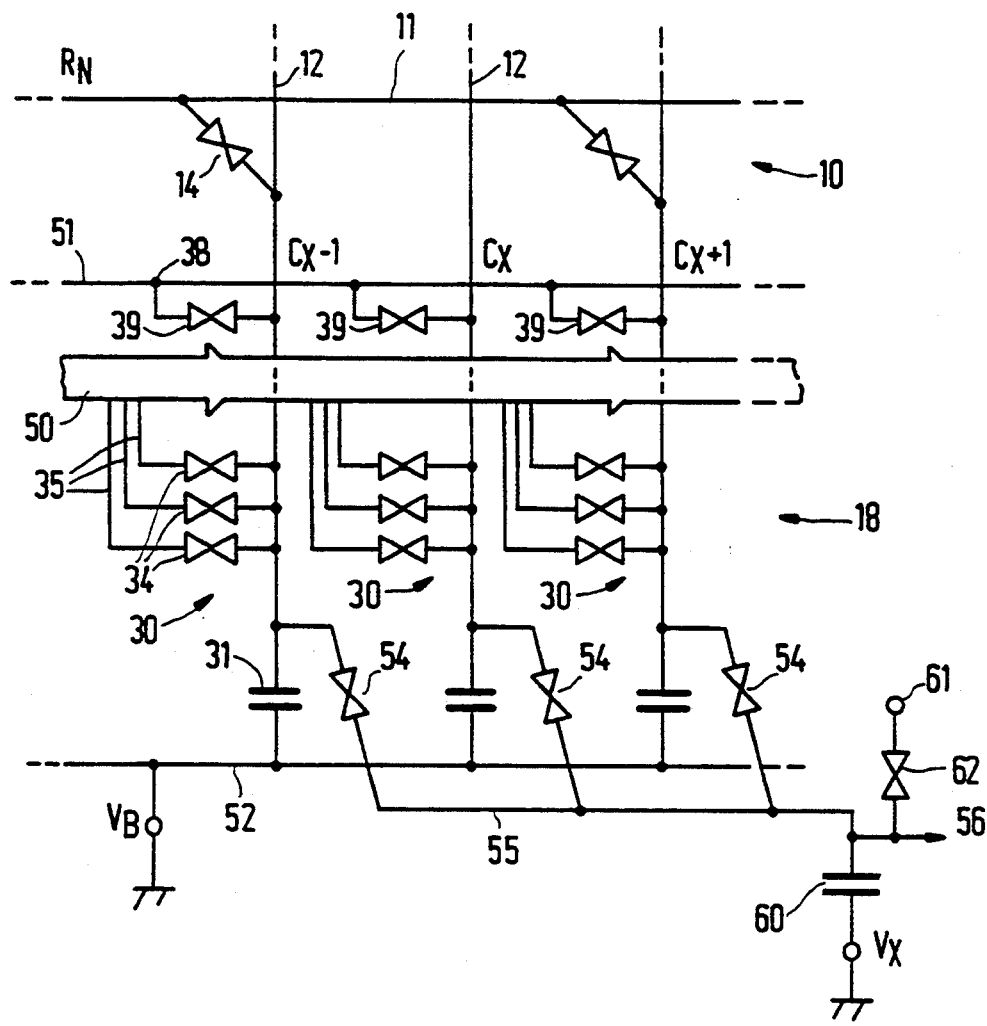
FIG. 9 shows part of one column decoder circuit used in the data storage device.

In an alternative embodiment of data storage device, using a simpler form of column decoder 18, OR gate circuit(s) are not employed and instead the sides of the capacitors 31 of the AND logic gate circuits 30 of the column decoder circuit are connected to a common output line, corresponding to the line 52 in FIG. 9, which, when reading data, is connected to an integrator circuit in the reading means 26. In this embodiment, the operating cycles of the row and column decoder circuits are controlled such that row and column conductors are addressed simultaneously by sycnhronising the I phases of the row and column operating cycles, whereby charge which flows into the capacitor 31 of the logic gate circuit of a selected column as a consequence of a MIM being present at the selected memory cell location is sensed by the integrating circuit of the reading means. A decision as to whether the output is a logic 1 or a logic 0 is provided by a comparator connected to the integrator circuit output, with a threshold voltage level half way between the logic 0 (which may itself be closed to 0 volts) and logic 1 levels. The integrator circuit output may comprise a summed parasitic component due to MIM devices present at other memory cell locations, but this is comparatively small compared with the total integrated output current in the case where a MIM is present at the selected cell location.

In addition to requiring fewer components in the data storage device, this integrating scheme of readout offers the further advantage over the previous embodiment using OR gate circuit(s) in that lower drive voltages can be used.

As in the preceding embodiment, a byte wide, e.g. 8 bits, parallel data output can be obtained if desired. To this end, the logic gate circuits of the column decoder would be arranged in groups, each comprising a number of adjacent logic gate circuits whose capacitors 31 are connected to a respective common output line which in turn is connected to a respective integrator circuit in the reading device 26 when reading out data.

2. Active Matrix Display Device

Figure 11:
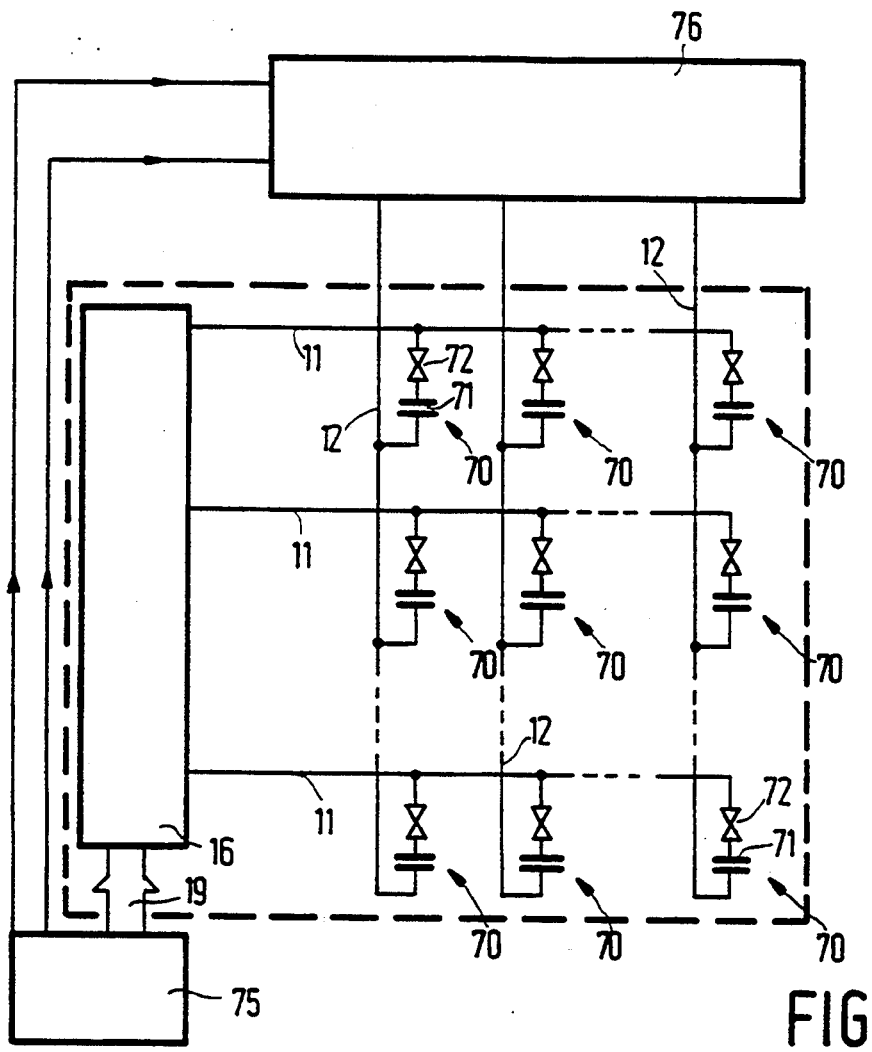
FIG. 11 illustrates schematically the circuit configuration of another embodiment of an electronic matrix array device according to the present invention which is in the form of an active matrix liquid crystal display device.

Referring now to FIG. 11, this shows a matrix array device according to the invention which here is in the form of an active matrix display device consisting of a row and column array of electro-optic picture elements. Each picture element includes a two terminal non-linear device n the form of a MIM device, acting as a switch. Display devices of this kind are well-known in the art and widely documented. Briefly, each picture element 70 comprises an electro-optic, for example liquid crystal, display element 71 connected in series with a MIM device 72 between respective row and column conductors of sets of row and column conductors 11 and 12 as before. Each row of picture elements shares the same row conductor 11 and each column of picture elements shares the same column conductor 12. The display elements 71 consist of first and second opposing electrodes carried on the respective surfaces of two glass supports with liquid crystal material sandwiched therebetween. The first electrodes are provided on the one support together with the MIM devices 72 and the set of row conductors 11, while the second electrodes are provided on the other support together with the set of column conductors 12.

The picture elements 70 are driven by row and column drive circuits which operate respectively to apply selection signals to the row conductors and data signals to the column conductors. The picture elements are driven a row at a time by applying a selection signal to each row conductor in turn, the data signals being applied to the appropriate column conductors in synchronism therewith, whereby the selected display elements are charged to a level dependent on the data signals to provide a desired display effect.

Conventionally, the row and column drive circuits are provided as separately formed integrated circuits which are connected to the sets of row and column conductors. In the present display device, the row drive circuit comprises a row decoder circuit 16 as described previously with reference to FIGS. 3 to 7, and which is carried on the one support together with the set of conductors 11 and the array of MIM devices 72 and fabricated simultaneously therewith. Such integration of the row drive circuit with the picture element array considerably simplifies manufacture of the display device.

The row decoder circuit 16 operates to apply a selection signal to each row conductor 11 in turn, thus selecting each row of picture elements 70 in sequence. To this end an addressing circuit 75 is connected to the address bus 19 to supply to the circuit 16 the appropriate sequence of address codes. However, for certain kinds of displays the addressing circuit 75 may be arranged to select rows of picture elements on an individual, rather than sequential, basis.

For display devices which are intended to display grey scales, the column drive circuit 76 in FIG. 11 can be of conventional form and provided as a circuit fabricated separately from the array of picture elements and connected to the column conductors in known manner. In some types of display devices in which grey scale display is not required, for example datagraphic displays whose picture elements need only produce an on/off (black/white) display, the column drive circuit may be a decoder circuit similar to the circuit 16. Individual picture elements can then be drive by the decoder circuits by selection of the associated row and column conductors.

With regard to all the above-described embodiments, it is envisaged that the MIM devices used in the arrays and the decoder circuits could be replaced by other suitable two terminal, thin film, non-linear devices, for example back to back Schottky diodes or diode rings, which similarly are bidirectional devices exhibiting a threshold characteristic.

Figure 12:
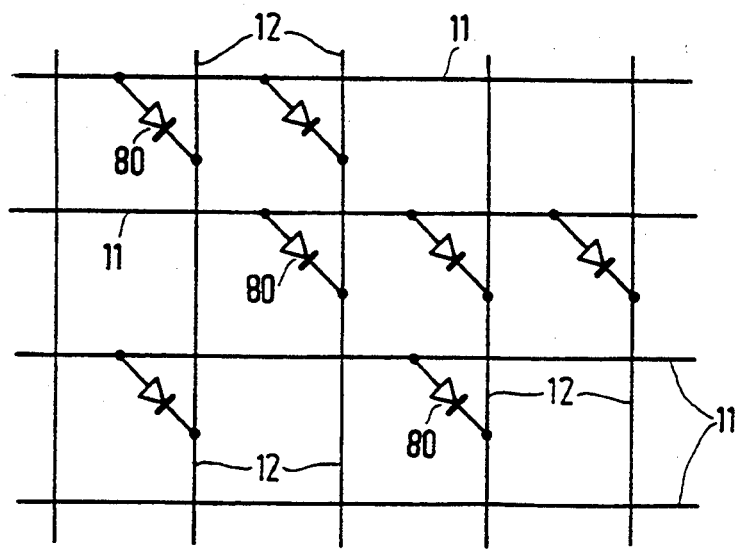
FIG. 12 shows part of the matrix array of a further embodiment according to the present invention which comprises a data storage device having an array of memory cells including unidirectional non-linear devices.

The invention is applicable also to electronic matrix arrays in which the two terminal thin film non-linear devices are unidirectional rather than bidirectional as previously described. Thus, as shown in FIG. 12, which is similar to FIG. 1 but shows schematically part of the memory cell array of an alternative embodiment of data storage device which uses unidirectional devices, namely diodes 80. As before, data is represented in the array by the presence (logic 1) or absence (logic 0) of a non-linear device at the row/column intersections defining the memory cells, each cell determining one bit of memory. Stored information can be retrieved a bit at a time by selecting the row and column conductors whose intersection defines the memory cell which is to be read. The selected row is given a positive voltage and the selected column is given a negative voltage. If a diode is present at the relevant cell a current will flow from the row conductor into the column conductor which can then be detected by a integrator to provide an output indicative of a logic 1. If no diode is present, no current will flow and the integrator then provides an input indicative of logic 0. In order to ensure that no current flows in any of the diodes present at unselected intersections, the memory cells other than the one selected are reverse biased. The unselected row conductors are kept at a low potential whilst the unselected column conductors are kept at a comparatively high potential. To ensure that only diodes that are connected to a selected row conductor or a selected column conductor other than at the intersection are reverse-biased as well, rather than simply zero-biased, the potential of the unselected column conductors is made slightly higher than that on the selected row conductor. By way of illustration, in order to read a particular memory cell selection voltages of $+V$ and $-V$ respectively are applied to the row conductor 11 and the column conductor 12 whose intersection defines the required cell, and voltages $-(V+a)$ and $+(V+a)$ are applied respectively to all other row conductors and column conductors, a being a fixed incremental voltage.

Figure 13:
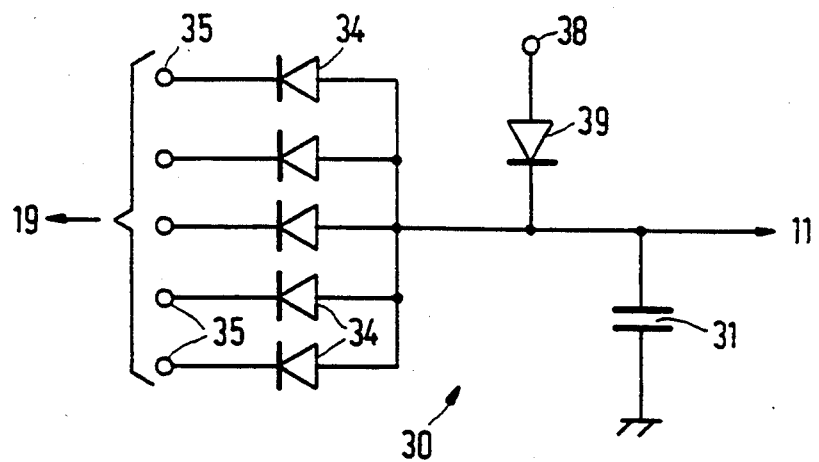
FIG. 13 shows schematically the configuration of a typical logic gate circuit used in a row decoder circuit of the data storage device of FIG. 12.
Figure 14:
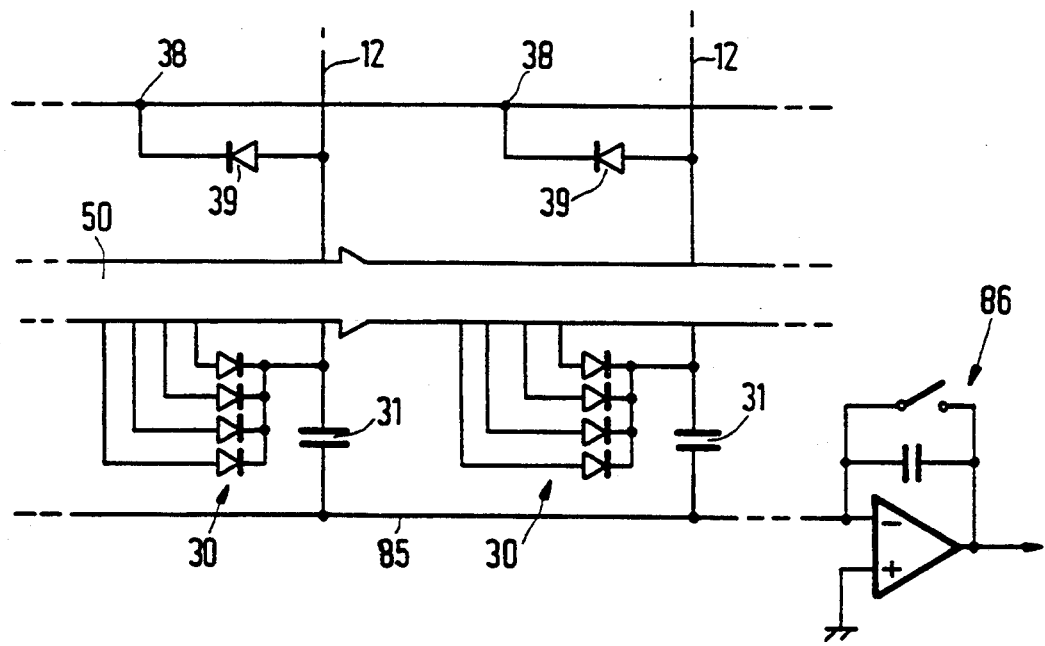
FIG. 14 shows part of a column decoder circuit of the data storage device of FIG. 12.

The sets of row and column conductors are connected respectively to row and column decoder circuits, which are generally similar to the circuits 16 and 18 described previously, except that unidirectional rather than bidirectional non-linear devices are employed, and in the same manner as depicted in FIG. 2 with the decoder circuits being fabricated with the memory array on the same support. Each stage of the row decoder circuit comprises a logic AND gate circuit using diodes rather than MIMs. The circuit configuration of a typical logic gate circuit is shown in FIG. 13 for comparison with the version described previously with reference to FIG. 3. It is to be noted that because unidirectional non-linear devices are used each logic gate circuit requires a reset input 38. The inputs 38 of all stages are connected to a common line of the address bus.

The logic gate circuits of the stages of the column decoder circuit are similar except for the way in which the diode elements are connected. As the AND gates of the row and column decoder circuits have to provide different voltages for the row and column conductors, i.e. $+V$ and $-(V+a)$ for the row conductors and $-V$ and $+(V+a)$ for the column conductors, the AND gates of the column decoder circuit are required to operate differently to those of the row decoder circuit. However, since the required voltages on the row and column conductors are symmetrical about zero for both the selected and the unselected case, it follows that the AND gates of the column decoder circuit can produce the desired voltage if they are exactly the opposite of the AND gates of the row decoder circuits, that is, with the diode elements being turned the other way round to that shown in FIG. 13, and all the input signals to the logic gate circuit need to be of opposite polarity.

The AND logic gate circuits of the row and column decoder circuits are addressed with address codes applied to their address buses as before, and function in similar manner to the previous logic gate circuits such that the output of the AND gate circuit operation is stored as a voltage on their associated row or column capacitor 31 respectively, after which the AND gate circuit is in effect turned off. During the time it is off, the selected row capacitor 31 can discharge into the selected column capacitor if a diode is present at the selected cell. After that the AND gate circuits are addressed again to select another cell. One terminal of the capacitors 31 of the column decoder circuits AND gate circuits is connected via a common line to an integrator, comprising a charge sensitive amplifier, as opposed to the capacitors 31 of the row decoder circuit which are simply connected to ground.

FIG. 4 shows a part of the column decoder circuit 18 comprising two stages connected to two adjacent column conductors 12. The sides of the output capacitors 31 are connected via a common line 85 to one input of an integrator circuit 86.

Stored data is determined by sensing current which flows through the selected, intersecting, conductors during the period that the AND gate circuits are in a non-active state, which will be referred to as the integration period.

Figure 15:
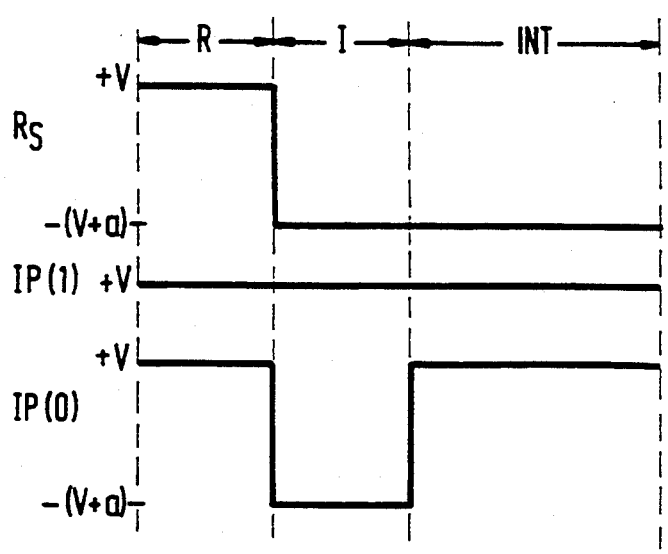
FIG. 15 illustrates waveforms present during operation of the row decoder circuit of the data storage device of FIG. 12.

Operation of this data storage device is accomplished in cycles consisting of reset and input phases, similar to those of the earlier embodiment, followed by the integration phase, from which one bit of information is obtained from the array. A typical operating cycle will now be described with reference to FIG. 15, which illustrates waveforms used i the operation of an AND gate circuit 30. RS is the reset signal applied to the inputs 38, IP (1) and IP (0) are logic 1 and logic 0 signals respectively, which can be applied via the address bus to inputs 35 of the circuit, R is the reset phase, I is the input phase, as previously, and INT is the integration phase. In the reset phase the voltages of all the capacitors 31 of the gate circuits 30 of the row decoder circuit 16 are brought to a predetermined level, corresponding to the high level to be used for a selected row, i.e. +V. This is achieved by applying high input signals to the inputs 35 and reset input 38 of the AND gate circuits 30 so that the capacitors 31 are charged to the reset voltage level via the reset diodes 39. At the start of the input phase the voltage at the reset inputs 38 is bought down to reverse bias the reset diodes 39, thereby turning these diodes off. A row conductor 11 which is to be selected is required to remain at this high level. This is achieved if the inputs 35 are all held by the applied address code at a logic 1 high level during this period, thus preventing charge on the capacitor 31 from flowing away through the input diodes 34. For the unselected row conductors the voltage on the associated capacitors 31 is required to be negative, i.e. $-(V+a)$. Bearing in mind that the AND gate circuits of all unselected row conductors will have at least one input at logic '0', this is achieved by the logic '0' waveform IP '0' which is low, $-(V+a)$, during the input phase so that the capacitors 31 of unselected row conductors are discharged.

During the integration phase, all the AND gate circuits 30 should in effect be disconnected. The input waveforms are thus selected so as to reverse bias the diodes 39 and 34 during this period.

The column decoder circuit 18 is operated in the same way except that the input signals to the AND gate circuits of this decoder circuit are exactly the opposite in polarity to those described above.

In the above description, the effects of any capacitance exhibited by the diodes has been ignored for simplicity. In practice the diodes are likely to have capacitance and this will result in deviations in t he voltage levels produced. If necessary, such deviations can be compensated by appropriate adjustment to the AND gate circuit input waveforms.

As mentioned, the AND gate decoder circuits 16 and 18 are connected to their associated address buses in similar manner to those of the previous embodiment described with reference to FIG. 7.

In this embodiment the output is obtained from the array using an integrator circuit connected to one side of the capacitors 31 of the AND gates circuits of the column decoder circuit 18. However, an OR gate circuit similar to that described with reference to FIG. 9, in which the bidirectional devices 54 and 62 are replaced by unidirectional diodes, may be used instead. Conversely, the OR gate circuit used in the embodiment of FIG. 9 may be omitted and an integrator circuit may be connected to the capacitors 31 of the AND gate circuits 30 of the column decoder circuit 18 via a common line in the above described manner. It should be appreciated that when using such an output configuration it is not essential for the integrator circuit 86 to be connected to the capacitors 31 of the column decoder circuit 18. Instead, the integrator circuit 86 could be connected to the capacitors 31 of the row decoder circuit 16 and the capacitors 31 of the column decoder circuit 18 connected to ground to achieve the same result.

Whilst the above-described embodiments of data storage devices comprise ROM arrays, it is envisaged that they could instead comprise other types of data stores, for example a PROM, using two terminal thin film non-linear devices.

The type of decoder circuits using unidirectional diodes described above may also be used as row and/or column drive circuits in an active matrix display device of the kind described with reference to FIG. 11. This is especially in cases where the bidirectional non-linear devices 72 of the picture elements 70 each consist of unidirectional devices, for example diode rings comprising two or more unidirectional pin diodes, or back to back diodes, allowing the row and/or column drive circuits to be readily integrated with the array of picture element non-linear elements 72 using the same fabrication technology.

From reading the present disclosure, other modifications will be apparent to persons skilled in the art. Such modifications may involve other features which are already known in the art of electronic matrix array devices and which may be used instead of or in addition to certain of the features already described herein.

I claim:

1. An electronic matrix device comprising:

an electronic matrix array formed by a set of row conductors crossing a set of column conductors, a matrix cell being at each intersection of the crossing conductors, a plurality of the matrix cells respectively comprising two-terminal thin film non-linear impedance elements;

a row address decoder having outputs respectively coupled to the respective conductors of the set of row conductors for supplying row selection signals thereto corresponding to row address signals supplied to inputs of said row address decoder;

a column address decoder having outputs respectively coupled to respective conductors of the set of column conductors for supplying column selection signals thereto corresponding to column address signals supplied to inputs of said column address decoder; and at least one of said decoders comprising a series of multi-input single-output logic gates, the output of each gate being a respective output of the decoder, the inputs of each gate being coupled to an address bus which is common to all gates and which supplies address signals from which each gate produces at its output a selection signal for the conductor connected to said output;

characterized in that each logic gate comprises:

(i) a charge storage capacitance at the output of said gate; and (ii) a plurality of two-terminal thin-film non-linear impedance elements of the same kind as said impedance elements in said matrix array, the impedance elements of each gate being respectively connected between a respective input of said gate and the output thereof so as to charge said storage capacitance to a charge voltage determined by the address signals supplied to the inputs of said gate, said charge voltage being stored by said capacitance so that the gate operates as a latch circuit, the stored voltage being indicative of the logic operation performed by said gate and constituting the selection signal produced at the output of said gate and applied to the conductor connected thereto.

2. An electronic matrix array device as claimed in claim 1, wherein each logic gate is an AND circuit which is operable to either of a first and a second logic state, each logic state producing a respective level of the charge voltage of the associated storage capacitance.

3. An electronic matrix array device as claimed in claim 1, wherein said at least one decoder is the row address decoder, the outputs of the respective logic gates thereof being respectively connected to respective conductors of the set of row conductors.

4. An electronic matrix array device as claimed in claim 1, wherein said at least one decoder is the column address decoder, the outputs of the respective logic gates thereof being respectively connected to respective conductors of the set of column conductors.

5. An electronic matrix array device according to claim 1, characterised in that the address bus comprises a plurality of address lines and in that the inputs of each logic gate circuit are connected to a respective and different combination of address lines.

6. An electronic matrix array device according to claim 1, characterised in that the two terminal thin film non-linear impedance elements are bidirectional.

7. An electronic matrix array device according to claim 6, characterised in that each logic gate has a reset input connected to the output thereof via a two terminal thin film non-linear impedance element for setting the capacitance voltage to a predetermined level in response to a reset signal applied to said reset input.

8. An electronic matrix array device according to claim 1, characterised in that the two terminal thin film non-linear impedance elements are unidirectional.

9. An electronic matrix array device according to claim 8, characterised in that each logic gate has a reset input connected to the output thereof via a unidirectional non-linear impedance element for setting the capacitance voltage to a predetermined level in response to a reset signal applied to said reset input.

10. An electronic matrix array device according to claim 1, characterised in that the matrix array device is a data storage device and the matrix cells thereof are memory cells.

11. An electronic matrix array device according to claim 10, characterised in that:

said at least one decoder is the column address decoder and the outputs of the respective logic gates thereof are respectively connected to respective conductors in said set of column conductors;

the outputs of at least one group of said gates are connected to respective inputs of a further multi-input single output logic gate having a capacitance connected to its output, each input of said further gate being connected via a two terminal thin film non-linear impedance element to the output of said further gate; said further gate being an OR gate circuit.

12. An electronic matrix array device according to claim 10, characterised in that one side of the capacitances of the logic gate circuits of the decoder circuit are interconnected via a common output line.

13. An electronic matrix array device according to claim 1, characterised in that said device is more particularly an active matrix electro-optic display device in which each matrix cell comprises a two terminal thin film non-linear impedance element connected in series with an electro-optic display element between the row and column conductors of the matrix cell.

14. An electronic matrix array device according to claim 1 in combination with drive circuit means connected to said address bus for applying signals to the address bus which include reset signals for setting the voltage of the capacitances of the logic gates to a predetermined level, followed by address signals for operating the logic gates such that the amounts of charge thereafter stored on the capacitances of selected and non-selected logic gates are respectively different.

15. An electronic matrix array device according to claim 14 characterised in that said drive circuit means includes an integrator circuit coupled to a common output line of said device on which output data is produced by said device.

* * * * *